US010604861B2

(12) United States Patent
Weinhold (10) Patent No.: US 10,604,861 B2
(45) Date of Patent: Mar. 31, 2020

(54) DEVICE FOR VERTICAL GALVANIC METAL DEPOSITION ON A SUBSTRATE

(71) Applicant: Atotech Deutschland GmbH, Berlin (DE)

(72) Inventor: Ray Weinhold, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 16/316,384

(22) PCT Filed: Aug. 18, 2017

(86) PCT No.: PCT/EP2017/070942
§ 371 (c)(1),
(2) Date: Jan. 9, 2019

(87) PCT Pub. No.: WO2018/036924
PCT Pub. Date: Mar. 1, 2018

(65) Prior Publication Data
US 2019/0292679 A1  Sep. 26, 2019

(30) Foreign Application Priority Data

Aug. 23, 2016  (EP) ..................................... 16185396

(51) Int. Cl.
*C25D 17/00* (2006.01)
*C25D 3/38* (2006.01)
(Continued)

(52) U.S. Cl.
CPC ............. *C25D 17/001* (2013.01); *C25D 3/38* (2013.01); *C25D 5/026* (2013.01); *C25D 5/08* (2013.01);
(Continued)

(58) Field of Classification Search
CPC . C25D 3/38; C25D 5/026; C25D 5/08; C25D 17/001; H01L 21/2885
See application file for complete search history.

(56) References Cited

U.S. PATENT DOCUMENTS 9,631,294 B2   4/2017 Weinhold et al.
2004/0026257 A1  2/2004 Gonzalez, Jr. et al.
(Continued)

FOREIGN PATENT DOCUMENTS

CN   104233410     12/2014
DE   102007026633  12/2008
(Continued)

OTHER PUBLICATIONS

PCT/EP2017/070942; PCT International Search Report and Written Opinion of the International Searching Authority dated Nov. 2, 2017.
(Continued)

*Primary Examiner* — Ciel P Thomas
(74) *Attorney, Agent, or Firm* — Renner, Otto, Boisselle & Sklar, LLP (57) ABSTRACT

Device for vertical galvanic metal deposition on a substrate comprising a first and a second device, arranged vertically parallel to each other; the first device comprising a first anode having a plurality of through-going conduits and a first carrier having a plurality of through-going conduits; wherein said first anode and said first carrier are connected to each other; wherein the second device comprises a first substrate holder adapted to receive a first substrate to be treated, wherein said first substrate holder at least partially surrounds the first substrate along its outer frame, wherein the first device further comprises a plurality of plugs, each plug comprising a through-going channel, each plug arranged such that it runs from the backside of the first carrier through a through-going conduit of the first carrier and further through the conduit of the first anode element, and the plugs are detachably connected to the first device.

13 Claims, 4 Drawing Sheets

(51) Int. Cl.
*C25D 5/02* (2006.01)
*C25D 5/08* (2006.01)
*C25D 17/12* (2006.01)
*H01L 21/288* (2006.01)

(52) U.S. Cl.
CPC ........... *C25D 17/12* (2013.01); *C25D 17/008* (2013.01); *H01L 21/2885* (2013.01)

(56) References Cited

U.S. PATENT DOCUMENTS

| | | | |
|---|---|---|---|
| 2004/0084318 A1* | 5/2004 | Cohen | C25D 5/08 205/98 |
| 2005/0067290 A1 | 3/2005 | Bonkass et al. | |
| 2009/0104569 A1 | 4/2009 | Liu | |
| 2010/0176004 A1 | 7/2010 | Schneider et al. | |
| 2012/0305404 A1 | 12/2012 | Keigler | |
| 2015/0329985 A1 | 11/2015 | Rauenbusch et al. | |
| 2016/0194776 A1 | 7/2016 | Weinhold et al. | |

FOREIGN PATENT DOCUMENTS

| | | | | |
|---|---|---|---|---|
| EP | 2746432 A1 * | 6/2014 | ........... | C25D 17/001 |
| EP | 2746433 | 6/2014 | | |

OTHER PUBLICATIONS

Search Report for Chinese Patent Application No. 2017800442935 dated Jun. 13, 2019.

* cited by examiner

DEVICE FOR VERTICAL GALVANIC METAL DEPOSITION ON A SUBSTRATE

The present application is a U.S. National Stage Application based on and claiming benefit and priority under 35 U.S.C. § 371 of International Application No. PCT/EP2017/070942, filed 18 Aug. 2017, which in turn claims benefit of and priority to European Application No. 16185396.5 filed 23 Aug. 2016, the entirety of both of which is hereby incorporated herein by reference.

FIELD OF THE INVENTION

The present invention relates to a device for vertical galvanic metal, preferably copper, deposition on a substrate comprising at least a first device element and a second device element, which are arranged in a vertical manner parallel to each other; wherein the first device element comprises at least a first anode element having a plurality of through-going conduits and at least a first carrier element having a plurality of through-going conduits; wherein said at least first anode element and said at least first carrier element are firmly connected to each other; wherein the second device element comprises at least a first substrate holder which is adapted to receive at least a first substrate to be treated, wherein said at least first substrate holder is at least partially surrounding the at least first substrate to be treated along its outer frame after receiving it.

The invention further relates to a method for vertical galvanic metal, preferably copper, deposition on a substrate using such a device.

BACKGROUND OF THE INVENTION

Production of semi conductive integrated circuits and other semi conductive devices from semiconductor wafers typically requires formation of multiple metal layers on the wafer to electrically interconnect the various devices of the integrated circuit.

Electroplated metals typically include copper, nickel, gold and lead. In a typical electroplating apparatus, an anode of the apparatus (either consumable or non-consumable) is immersed in the electroplating solution within the reactor vessel of the apparatus for creating the desired electrical potential at the surface of the work piece for effecting metal deposition. Previously employed anodes have typically been generally disk-like in configuration, with electroplating solution directed about the periphery of the anode, and through a perforate diffuser plate positioned generally above, and in spaced relationship to, the anode. The electroplating solution flows through the diffuser plate, and against the associated work piece held in position above the diffuser. Uniformity of metal deposition is promoted by rotating the work piece while metal is deposited on its surface.

Subsequent to electroplating, the typical semiconductor wafer or other work piece is subdivided into a number of individual semiconductor components. In order to achieve the desired formation of circuitry within each component, while achieving the desired uniformity of plating from one component to the next, it is desirable to form each metal layer to a thickness which is as uniform as possible across the surface of the work piece. However, because each work piece is typically joined at the peripheral portion thereof in the circuit of the electroplating apparatus (with the work piece typically functioning as the cathode), variations in current density across the surface of the work piece are inevitable. In the past, efforts to promote uniformity of metal deposition have included flow-controlling devices, such as diffusers and the like, positioned within the electroplating reactor vessel in order to direct and control the flow of electroplating solution against the work piece.

US 2016/194776 A1 discloses a device for or vertical galvanic metal deposition on a substrate wherein the device comprises at least a first device element and a second device element, which are arranged in a vertical manner parallel to each other, wherein the first device element comprises at least a first anode element having a plurality of through-going conduits and at least a first carrier element having a plurality of through-going conduits, wherein said at least first anode element and said at least first carrier element are firmly connected to each other; and wherein the second device element comprises at least a first substrate holder which is adapted to receive at least a first substrate to be treated, wherein said at least first substrate holder is at least partially surrounding the at least first substrate to be treated along its outer frame after receiving it; and wherein the distance between the first anode element of the at least first device element and the at least first substrate holder of the second device element ranges from 2 to 15 mm; wherein the plurality of through-going conduits of the first carrier element of the first device element are going through the first carrier element in form of straight lines having an angle relating to the perpendicular on the carrier element surface between 10° and 60°.

US 2012/305404 A1 discloses an apparatus for fluid processing at least one workpiece, comprising a housing configured to hold a fluid; a workpiece holder disposed within the housing and configured to retain the at least one workpiece; and an electric field shield plate disposed within the housing adjacent each of the at least one workpiece, the electric field shield plate having at least one contoured area configured to vary a gap from the electric field shield plate to a surface of the workpiece, the gap being defined by the at least one contoured area of the electric field shield plate and a corresponding portion of the surface of the workpiece facing the electric field shield plate.

US 2004/026257 A1 discloses a system for electroplating conductive films on a semiconductor wafer, comprising a cathode and an anode disposed in a reservoir, a first one of the cathode and the anode being electrically associated with the wafer; an electrical power supply operatively coupled with the cathode and the anode to provide an electrical field through an electrolytic fluid between the cathode and the anode in the reservoir; field adjustment apparatus located in the reservoir between the cathode and the anode, the field adjustment apparatus comprising a plate comprising a first side generally facing the wafer, a second side generally facing a second one of the cathode and the anode, and a plurality of plate apertures extending through the plate between the first and second sides; and a plug positioned in one of the plurality of plate apertures to influence the electrical field near the plug.

DE 10 2007 026633 A1 discloses an apparatus for the electrolytic treatment of a plate-shaped product, which is disposed in the apparatus and has at least one substantially planar treatment surface, using a treatment agent, wherein the apparatus comprises: i) devices for retaining the product in the apparatus, ii) one or a plurality of flow devices, which each include at least one nozzle and are disposed situated opposite the product, iii) one or a plurality of counter electrodes, which are inert relative to the treatment agent and are disposed parallel to at least one treatment surface, iv) means for generating a relative movement between the product, on the one side, and the flow devices and/or the counter electrodes, on the other side, in directions parallel to a treatment surface, wherein the means for generating the relative movement are designed to move the product, wherein the relative movement is an oscillating movement and wherein the means for generating the oscillating movement are designed such that the relative movement takes place in two directions that are orthogonal to each other.

EP 2746433 A1 discloses a device for vertical galvanic metal, preferably copper, deposition on a substrate wherein the device comprises at least a first anode element having at least one through-going conduit, at least a first carrier element comprising at least one through-going conduit, at least a first fluid feeding element for leading a treating solution inside said at least first carrier element, at least a first fastening means and at least a first electrical connecting element; wherein said at least first anode element and said at least first carrier element are firmly connected to each other; and wherein said at least first fastening means for fixing the entire device detachable inside of a container suitable for receiving such a device and said at least first electrical connecting element for providing electrical current to the at least first anode element are arranged both on the backside of said at least first carrier element.

However, there is still a high demand in the market to provide amended devices and methods using such new amended devices for the galvanic metal deposition, in particular for the vertical galvanic metal deposition.

Typically, the known devices and methods suffer from significant drawbacks in form of non-uniform deposition of such galvanic metals. Further, such known devices and methods are commonly strongly limited in their capacities to successfully and effectively execute bridge-building of galvanic metal in interconnecting holes of the substrate to be treated with subsequent filling of them without generating enclosed voids, gases, electrolytic liquids and alike arising known technical disadvantages like short circuit and alike. The same problem encounters with filling of blind holes in substrates like printed circuits boards, wafers or alike.

OBJECTIVE OF THE PRESENT INVENTION

In view of the prior art, it was thus an object of the present invention to provide a device for vertical galvanic metal deposition on a substrate, which shall not exhibit the aforementioned shortcomings of the known prior art devices.

What is needed therefore is a way to deposit a galvanic metal on at least one side of a substrate in a uniform way without having non-uniform portions or thickness gradients over the surface of said at least one side of the substrate.

Additionally, it is a further object of the invention to provide a device which is not solely capable to deposit a galvanic metal on one side of a substrate, but also to fill blind holes in said substrate.

SUMMARY OF THE INVENTION

These objects and also further objects which are not stated explicitly but are immediately derivable or discernible from the connections discussed herein by way of introduction are achieved by a device having all features of claim 1. Appropriate modifications to the inventive device are protected in dependent claims. Further, the invention comprises a method for vertical galvanic metal, preferably copper, deposition on a substrate using such a device, whereas an appropriate modification of said inventive method is comprised by the dependent method claim.

The present invention accordingly provides a device for vertical galvanic metal, preferably copper, deposition on a substrate, wherein the device comprises at least a first device element and a second device element, which are arranged in a vertical manner parallel to each other; wherein the first device element comprises at least a first anode element having a plurality of through-going conduits and at least a first carrier element having a plurality of through-going conduits; wherein said at least first anode element and said at least first carrier element are firmly connected to each other; wherein the second device element comprises at least a first substrate holder which is adapted to receive at least a first substrate to be treated, wherein said at least first substrate holder is at least partially surrounding the at least first substrate to be treated along its outer frame after receiving it, characterized in that the at least first device element further comprises a plurality of plugs, wherein each plug comprises at least a through-going channel, and wherein each plug is arranged in such a way that each plug is running from the backside of the at least first carrier element through a through-going conduit of the at least first carrier element and further through the respective in front lying through-going conduit of the at least first anode element; and wherein all of the plugs are detachably connected to the at least first device element.

It is thus possible in an unforeseeable manner to provide a device for vertical galvanic metal deposition on a substrate, which does not exhibit the aforementioned shortcomings of the known prior art devices.

In addition thereto, the device of the present invention offers a way to deposit a galvanic metal on at least one side of a substrate in a uniform way without having non-uniform portions or thickness gradients over the surface of said at least one side of the substrate.

Furthermore, the present invention provides a device which is not solely capable to deposit a galvanic metal on one side of a substrate, but also to fill blind holes in said substrate.

Further, the device of the present invention, which includes a plurality of plugs, offers thereby the additional advantage compared to the sole use of through-going conduits that the electrolytic volume flows through at least a through-going channel, which can be provided in a much higher quality than said through-going conduits. The through-going channels provide on the one hand a possibility to save cost by making use of cheap mass-produced injection molded plugs made of a non-metallic material. On the other hand the plugs provide a cleaner, particle free inner surface of the through-going channels without having residual impurities from a drilling or milling out manufacturing process as commonly used for producing the through-going conduits. Even when these drilled or milled out through-going conduits are subsequently cleaned, it would additionally require much manpower and a lot of working time to achieve at least comparable clean channels.

Further, the device of the present invention, wherein all of the plugs are detachably connected to the at least first device element, offers the additional advantage that the electrolytic volume flow is easily adaptable to new system requirements according to specific new customer demands. It is easily possible to replace certain plugs by other different plugs, such as plugs with a through-going channel having a different diameter over the whole length of the through-going channel. It is also advantageous for maintenance reasons because it is easily possible to replace damaged or undesired plugs.

The inventive device serves to generate a suitable constant electrolytic volume flow, in particular of an electrolytic solution known in the prior art, which induces an as high as possible constant electrolytic volume flow from the center of the surface of the substrate to be treated directed to the outer edges of said substrate to be treated.

BRIEF DESCRIPTION OF THE FIGURES

Objects, features, and advantages of the present invention will also become apparent upon reading the following description in conjunction with the figures, in which.

DETAILED DESCRIPTION OF THE INVENTION

As used herein, the term "galvanic metal", when applied to a device for vertical galvanic metal deposition on a substrate in accordance with the present invention, refers to metals which are known to be suitable for such a vertical deposition method. Such galvanic metals comprise gold, nickel, and copper, preferably copper.

It has to be noted that each through-going conduit of the at least first anode element has to be aligned with at least one respective through-going conduit of the at least first carrier element in order to allow a constant electrolytic volume flow to the substrate to be treated.

As used herein, the term "firmly connected" refers to a connection of the at least first carrier element and the at least first anode element lying in front of said carrier element without having any remarkable distance between them. Such a distance being not negligible would lead to a disadvantageous broadening of the electrolytic volume flow after having passed the through-going conduits of the carrier elements before reaching the respective through-going conduits of the first anode element in case that there is no plug inserted in the respective through-going conduit of the at least first anode element and the at least first carrier element.

It has been found advantageous, if such a remarkable distance between the firmly connected first carrier element and the first anode element is smaller than 50 mm, preferably smaller than 25 mm, and more preferably smaller than 10 mm.

The plugs are made of any kind of suitable non-metallic material such as polymeric materials. As outlined above, it is especially preferred to make them out of a material, which is suitable to be used in an injection molding manufacturing process.

The diameter of the through-going channel over the whole length of the through-going channel is ranging from 0.1 to 5 mm, preferably from 0.2 to 3 mm, and more preferably from 0.35 to 1.5 mm.

In a preferred embodiment, more than 50%, more preferably more than 80%, and most preferably more than 90%, of the through-going conduits of the at least first device element comprise a respective plug having at least a through-going channel.

In an alternative embodiment hereto, all through-going conduits of the at least first device element comprise a respective plug having at least a through-going channel.

It has been found advantageous to make use of a distance between the first anode element of the at least first device element and the at least first substrate holder of the second device element ranging from 2 to 15 mm, preferably from 3 to 11 mm, and more preferably from 4 to 7 mm.

As used herein, the distance between the first anode element and the opposite lying substrate holder is measured as the length of the perpendicular going from the surface of said first anode element to the opposite lying surface of said substrate holder.

In one embodiment, the at least first anode element is an insoluble anode comprising a material coated with titanium or an iridium oxide.

In the context of the present invention, the at least first substrate to be treated can be round, preferably circular, or angular, preferably polyangular, such as rectangular, quadratic or triangular, or a mixture of round and angular structure elements, such as semicircular. The at least first substrate to be treated can have a diameter ranging from 50 mm to 1000 mm, preferably from 100 mm to 700 mm, and more preferably from 120 mm to 500 mm, in case of a round structure; or a side length ranging from 10 mm to 1000 mm, preferably from 25 mm to 700 mm, and more preferably from 50 mm to 500 mm, in case of an angular, preferably polyangular, structure. The at least first substrate to be treated can be a printed circuit board, a printed circuit foil, a semiconductor wafer, a wafer, a solar cell, a photoelectric cell, a flat panel display or a monitor cell. The first substrate to be treated can be composed of one material or of a mixture of different materials, such as glass, plastics, molded compounds or ceramics.

It can be further intended by the present invention that the general shape of the at least first anode element and/or of the at least first carrier element of the first device element is orientated at the general shape of the substrate to be treated and/or of the substrate holder of the second device element. Hereby, the galvanic metal deposition can still be made more efficient and cost saving by reducing the required device construction conditions. This especially applies for a circular, a rectangular or a quadratic substrate to be treated.

In one embodiment, the first anode element comprises at least two segments, wherein each anode element segment can be electrically controlled and/or regulated separately from each other.

In a further embodiment, an anode segment, preferably the most exterior anode segment, the most exterior area inside of an anode segment, preferably inside of the most exterior anode segment, and/or an area at the center of the first anode element is comprised without through-going conduits and plugs.

In particular, the control and/or the regulation of the current can be advantageous in order to reduce the metal, in particular the copper, deposition at desired sites of the surface of the substrate to be treated, such as in the most exterior segment and/or the most exterior area inside of an anode segment of the at least first anode element of the first device element.

The most exterior anode segment and/or anode area inside of the most exterior anode segment of the at least first anode element of the first device element can comprise a surface area percentage of the overall anode element surface area of at least 5%, preferably of at least 10%, and more preferably of at least 15%.

The most interior anode segment and/or anode area inside of the most interior anode segment of the at least first anode element of the first device element can comprise a surface area percentage of the overall anode element surface area of at least 30%, preferably of at least 50%, and more preferably of at least 70%.

The at least first anode element of the first device element comprise at least one fastening element going through said at least first anode element and the at least first carrier element of the first device element. In case that more than one anode element and/or more than one anode segment is provided in the first device element, it can be intended that at least one fastening element is separately provided for each anode element and/or anode segment of the first device element. Further, it can be intended in the sense of the present invention that these fastening elements provide simultaneously the electrical contact elements of the at least one anode element and/or one anode segment of the first device element.

In one embodiment, the end of at least a part of the plugs, preferably of all the plugs, are aligned with the surface of the at least first anode element.

Alternatively, it is also possible in the context of the invention that the plugs are running from the backside of the at least first carrier element through the respective through-going conduit of the at least first carrier element and further through the respective in front lying through-going conduit of the at least first anode element in such a way that the respective end of the plug is protruding a little bit, preferably ranging from 0 to 0.50 mm, more preferably from 0.10 to 0.40 mm, and most preferably from 0.24 to 0.32 mm, from the surface of the respective at least first anode element with the end of the plug. This enhances the quality of the electrolytic volume flow by avoiding any edge effects of the surface of the respective at least first anode element on the electrolytic volume flow and the thereby resulting electrolytic spray pattern.

Such an above-described disadvantage of a negatively influenced electrolytic spray pattern could exemplarily result of plugs being too short to reach the surface of the at least first anode element.

In the context of the present invention, the first anode element surface means the surface of the first anode element, which is directed to the opposite lying surface of the substrate to be treated.

In the context of the present invention, the first carrier element surface means the surface of the first carrier element, which is directed to the in front lying surface of the first anode element.

However, it would be the ideal case that the end of the plug is aligned with the surface of the at least first anode element, meaning that the total length of the plug is adjusted in such a way that the plug ends precisely at the surface of the at least first anode element.

In one embodiment, the plurality of the plugs are uniformly distributed, preferably in form of a dot matrix, over the at least first anode element.

This specific embodiment offers an approach of generating a uniform electrolytic volume flow and thereby a uniform galvanic metal deposition on the substrate to be treated.

In an alternative embodiment to the aforementioned embodiment, the plurality of the plugs are non-uniformly distributed over the at least first anode element, preferably in such a way that the number of plugs per defined area is decreasing from the center of the at least first anode element to a more exterior area of the respective first anode element.

This offers the advantage that the total electrolytic volume flow flowing from the center of the at least first device element to the outer edges is not continuously enlarging too much by the additional electrolytic volume flow coming through the plugs lying more exterior.

In one embodiment, the through-going channel of each plug comprises the same constant diameter over the whole length of the through-going channel.

In another embodiment, the through-going channel of the plugs comprises a constant diameter over the whole length of the through-going channel, which is different among the plurality of the plugs.

In a preferred embodiment of this aforementioned embodiment, the constant diameter of the through-going channel over the whole length of the through-going channel of the respective plug is decreasing from a plug in the center of the at least first device element to a plug being arranged more exterior in the respective first device element.

This offers the advantage that the total electrolytic volume flow flowing from the center of the at least first device element to the outer edges is not continuously enlarging too much by the additional electrolytic volume flow coming through the plugs lying more exterior. The smaller the diameter of the through-going channel over the whole length of the through-going channel of the plug, the higher is the velocity of the electrolytic volume flow running through the plug. Thereby, it is possible to support a faster flowing of the total electrolytic volume flow from the center of the at least first device element to the outer edges.

In an alternative embodiment, the constant diameter of the through-going channel over the whole length of the through-going channel of the respective plug is increasing from a plug in the center of the at least first device element to a plug being arranged more exterior in the respective first device element.

This offers the possibility to adapt the system of plugs in such a way to enable the user to generate specific electrolytic volume flow conditions at specific sites, such as by choosing a different constant diameter over the whole length of the through-going channel in a first sub-area of the respective first device element and another one in a second sub-area of the respective first device element. This offers a maximum of adjustment possibilities for a user in order to be able to adapt the device for each substrate to be treated in a unique manner.

In one embodiment, the at least first device element further comprises a plurality of dummy plugs, wherein said dummy plugs do not possess any kind of through-going channel.

Herein, the dummy plugs can be provided additionally to the plugs having at least a through-going channel and/or the dummy plugs can substitute some of the plugs having at least a through-going channel. This offers a promising approach to influence the electrolytic volume flow in a desired way in order to adjust the electrolytic volume flow directed to the surface of the substrate to be treated in dependence of certain different customer demands. The more dummy plugs are exemplarily substituting a certain number of plugs having at least a through-going channel in a defined surface area of the at least first device element, the less is the total electrolytic volume flow in said area. The same applies vice versa.

In one embodiment, the plurality of through-going conduits of the first anode element are going through the first anode element in form of straight lines having an angle relating to the perpendicular on the first anode element surface between 0° and 80°, preferably between 10° and 60°, and more preferably between 25° and 50°, or or alternatively ranging from 0° to 20°, preferably from 0° to 10°, and more preferably from 0° to 5°.

Herein, said through-going conduits comprise commonly a round or elliptical cross section. Alternatively, a cross section of an oblong hole, preferably wherein the oblong holes have an orientation from the center to the outside of the first anode element can be provided.

In one embodiment, the plurality of through-going conduits of the first carrier element are going through the first carrier element in form of straight lines having an angle relating to the perpendicular on the first carrier element surface between 0° and 80°, preferably between 10° and 60°, and more preferably between 25° and 50°, or alternatively ranging from 0° to 20°, preferably from 0° to 10°, and more preferably from 0° to 5°.

Herein, said through-going conduits comprise commonly a round, preferably a circular, cross section.

In one embodiment, the plurality of through-going conduits of the first anode element are going through the first anode element in form of straight lines having an angle α relating to the perpendicular on the first anode element surface, wherein the plurality of through-going conduits of the first carrier element are going through the first carrier element in form of straight lines having an angle β relating to the perpendicular on the first carrier element surface, and wherein α and β are essentially the same.

The phrase "α and β are essentially the same" according to the present invention refers to the case that α and β are essentially identical. Preferably, a deviates less than 5°, more preferred less than 3°, even more preferred less than 1° from β. Typically, it is preferred that α and β are identical.

Herein, an angle of 0° is especially preferred. However, if a controlled electrolytic volume flow directed to the outer edges of the substrate to be treated is desired, an angle between 10° and 60° is alternatively preferred.

In one embodiment, the plurality of through-going conduits of the first carrier element are arranged on the surface of said first carrier element in form of concentric circles around the center of the first carrier element.

Herein, it is more preferred that the through-going conduits inside of a concentric circle around the center of the first carrier element comprise different angles, preferably comprising parts of the concentric circle wherein each second through-going conduit comprise the opposite angle of the respective precedent through-going conduit relating to the perpendicular on the carrier element surface. It is even more preferred that each second through-going conduit of the concentric circle comprise the opposite angle of the respective precedent through-going conduit relating to the perpendicular on the carrier element surface.

Alternatively, the through-going conduits inside of a first concentric circle arranged close around the center of the first carrier element comprise smaller angles than the through-going conduits inside of an at least second concentric circle being more exterior than the first concentric circle around the center of the first carrier element, preferably wherein the through-going conduits inside of all more exterior concentric circles of through-going conduits of the first carrier element comprise larger angles, in particular all the same larger angle.

In one embodiment, the at least first anode element is at least partially surrounded by the at least first carrier element, wherein the side of said at least first carrier element directed towards said at least first anode element has a cavity to take said at least first anode element in such a way that the upper edges of the at least first carrier element and of the at least first anode element are aligned or not, preferably aligned.

Such a device offers a highly compact arrangement of the first device element based on the preferred alignment of the upper edges of the first carrier element and the first anode element. Thus, the first anode element is not a separated piece of the device spaced apart from the first carrier element as known in prior art, but it represents a uniform device unit leading to a smaller device saving cost, wherein the first anode element supports as well the stability of the whole first device element.

The present invention provides a device that ensures a constant volume flow speed of the treating solution wherein the volume flow speed is ranging from 0.1 to 30 m/s, preferable from 0.5 to 20 m/s, and more preferably from 1 to 10 m/s.

The total volume of the treating solution, which is flowing from the surface of the center of the substrate to be treated to the outer edges of the substrate to be treated, is constantly increasing due to the fact that additional volume flow is reaching the substrate surface through the through-going conduits of the at least first carrier element and the at least first anode element of the first device element and combines with the volume flow already passing the substrate surface on its way from the center to the outer edges of the substrate.

The overall thickness of the at least first carrier element of the first device element is ranging from 4 mm to 25 mm, preferably from 6 mm to 18 mm, and more preferably from 8 mm to 12 mm; whereas the overall thickness of the at least first anode element of the first device element is ranging from 1 mm to 20 mm, preferably from 2 mm to 10 mm, and more preferably from 3 mm to 5 mm.

The alignment of the upper edges of the at least first carrier element and of the at least first anode element of the first device element, supports the above-cited limitation of the overall thickness of the at least first anode element of the first device element due to the fact that the side of the at least first carrier element and of the at least first anode element of the first device element, opposite to the respective side of the substrate to be treated of the second device element shall possess a uniform flat surface without any obstacles in form of height differences between the at least first carrier element and of the at least first anode element of the first device element.

In an alternative embodiment thereto, the first device element further comprises a second carrier element detachably connected to the at least first anode element, and preferably also to the at least first carrier element. Herein, the at least first anode element, and preferably also the at least first carrier element, is, preferably are, at least partially surrounded by said second carrier element, wherein the upper edges of the second carrier element and the first anode element directed towards the second device element are aligned or not, preferably aligned. Herein, said second carrier element can also be an at least partially surrounding element arranged on the front surface of the at least first anode element, in particular a ring.

In a preferred embodiment, the device further comprises a third device element, which is arranged in a vertical manner parallel to the first device element and the second device element in such a way that the second device element is arranged between said first device element and said third device element. Herein, the third device element is preferably identical to the first device element.

In a more preferred embodiment herein, the angles of the through-going conduits of the first carrier element of the first device element being opposite to the through-going conduits of the first carrier element of the third device element are the same or different, preferably the same.

In another more preferred embodiment herein, the third device element is arranged in such a way that the plurality of through-going conduits of the first carrier element of the first device element are distributed in the same or different way as the plurality of through-going conduits of the first carrier element of the third device element.

In another more preferred embodiment herein, the first device element and the third device element are rotated against each other inside of the parallel plane of the vertical arrangement in order to set a specific orientation of the through-going conduits of the first carrier element of the first device element versus the through-going conduits of the first carrier element of the third device element.

In one embodiment, the first device element and/or the third device element further comprises a masking element having a plurality of through-going conduits, which is detachably connected to the at least first anode element of the first device element and/or of the third device element, and preferably also to the at least first carrier element of the first device element and/or of the third device element. Herein, the distribution of the plurality of through-going conduits on the surface of said masking element can be homogeneous or inhomogeneous.

Such a masking element, which is arranged in front of the respective first anode element of the first and/or third device element, influences the distribution and the formation of the electric field coming from the first anode element on its way to the substrate to be treated. Thus, in dependence of the kind of substrate to be treated, which is intended to be used, the masking element offers the possibility to influence said electric field in such a way that a most effective desired uniform electric field distribution is generated, which again leads consequently to a most effective uniform galvanic metal deposition on the surface of the substrate to be treated.

It is also possible to generate different desired galvanic metal deposition density areas during the galvanic metal deposition process in order to be able to handle substrates to be treated, which comprise different areas with different densities of blind holes and/or through connecting vias. Thus, the masking element can be individually designed in dependence of the surface and/or of the structural composition or layout of the substrate to be treated.

Such an individual design can be generated by an intended certain distribution of the through-going conduits of the masking element, which possesses so a kind of individual perforated structure. The masking element shall have, to be effective, a size of at least the same dimension as the first anode element to avoid undesired electric field edge effects.

Further, the object of the present invention is also solved by a method for vertical galvanic metal, preferably copper, deposition on a substrate characterized by the following method steps:

i) Providing such an inventive device, ii) Guiding an electrolytic volume flow through the through-going channels of the plugs to the side of the at least first substrate to be treated received by the at least first substrate holder of the second device element, wherein said side of the at least first substrate is directed to the anode surface of the first anode element of the first device element, iii) Moving the second device element in two directions parallel to the treated side of the at least first substrate to be treated, wherein the two directions, into which the at least first substrate to be treated is moved, are orthogonal to each other and/or wherein the substrate is moved in an oscillating manner, preferably moved on a circular path parallel to the treated side of the at least first substrate to be treated.

It has been found advantageous in the present invention that the incoming electrolytic volume flow shall, if possible, reach the openings of the plugs on the backside of the at least first carrier element all with the same, or at least with relatively similar, pressure to ensure a constant electrolytic volume flow through the plugs running from the backside of the at least first carrier element through the through-going channels of the plugs to reach the surface of the substrate to be treated of the second device element having the same, or at least relatively similar, electrolytic volume flow and electrolytic volume flow speed.

In a preferred embodiment of the method, the method is characterized in that in method step i) the inventive device comprises further a third device element, wherein the second device element is arranged between the first device element and the third device element and wherein said third device element comprises at least a first anode element having a plurality of through-going conduits and at least a first carrier element having a plurality of through-going conduits; wherein said at least first anode element and said at least first carrier element are firmly connected to each other; wherein the third device element further comprises a plurality of plugs, wherein each plug comprises at least a through-going channel, and wherein each plug is arranged in such a way that each plug is running from the backside of the at least first carrier element through a through-going conduit of the at least first carrier element and further through the respective in front lying through-going conduit of the at least first anode element; and that in method step ii) a second electrolytic volume flow is guided through the through-going channels of the plugs to the side of the at least first substrate to be treated received by the at least first substrate holder of the second device element, wherein said side of the at least first substrate is directed to the anode surface of the first anode element of the third device element; and that in method step iii) the second device element is moved between the first device element and the third device element in two directions parallel to the treated side of the at least first substrate to be treated, wherein the two directions, into which the at least first substrate to be treated is moved, are orthogonal to each other and/or wherein the substrate is moved in an oscillating manner, preferably moved on a circular path parallel to the treated side of the at least first substrate to be treated.

The present invention thus addresses the problem of providing a device for vertical galvanic metal, preferably copper, deposition on a substrate; and a method using such a device which successfully overcomes the above-mentioned shortcomings of the prior art.

The following non-limiting examples are provided to illustrate a preferred embodiment of the present invention wherein the first anode element of the first device element is completely surrounded by the first carrier element of the first device element, wherein the side of said first carrier element directed towards said first anode element has a cavity to take said first anode element in such a way that the upper edges of the first carrier element and of the first anode element are aligned. Said preferred embodiment shall facilitate the understanding of the invention, but are not intended to limit the scope of the invention, which is defined by the claims appended hereto.

Figure 1:
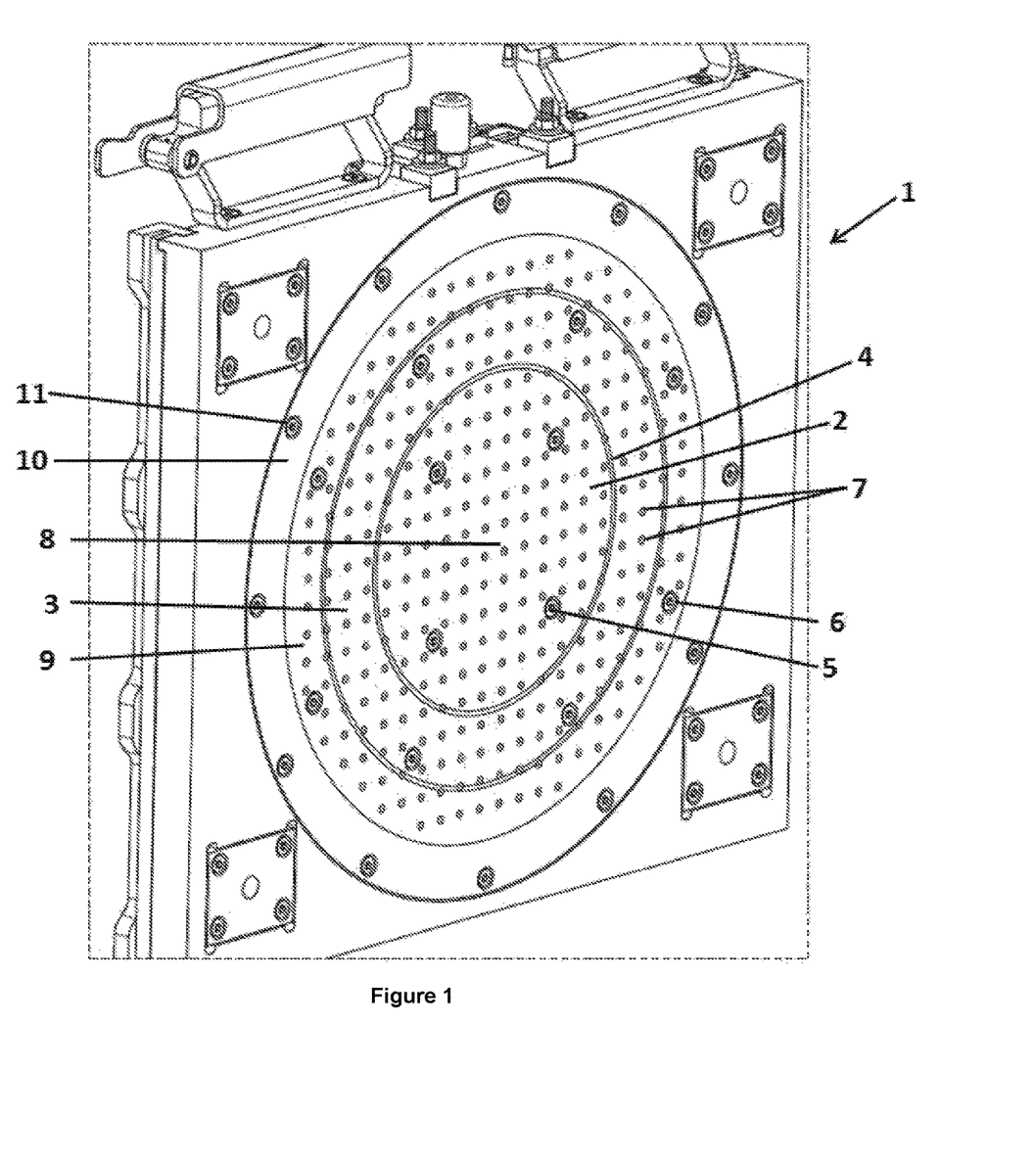
FIG. 1 shows a schematic front view of a device comprising a first anode element firmly connected to a first carrier element of a first device element of a preferred embodiment of the present invention.

Turning now to the Figures, FIG. 1 shows a schematic front view of a device according to a preferred embodiment of the present invention.

Herein, a device for vertical galvanic metal, preferably copper, deposition on a substrate comprising a first device element 1 is shown, wherein the first device element 1 comprises a first anode element having a plurality of through-going conduits and a first carrier element 10 having a plurality of through-going conduits.

Herein, the first anode element and the first carrier element 10 are firmly connected to each other.

The first device element 1 further comprises a plurality of plugs 7, wherein each plug comprises a through-going channel, and wherein each plug is arranged in such a way that each plug is running from the backside of the first carrier element 10 through a through-going conduit of the first carrier element 10 and further through the respective in front lying through-going conduit of the first anode element.

Herein, the end of all the plugs 7 are aligned with the surface of the first anode element, wherein all of the plugs 7 are detachably connected to the first device element 1.

In this preferred embodiment shown in FIG. 1, all plugs 7 are uniformly distributed in form of a dot matrix over the first anode element, wherein the through-going channel of each plug 7 comprises the same constant diameter over the whole length of the through-going channel (12).

Herein, all through-going conduits of the first anode element are going through the first anode element in form of straight lines having an angle relating to the perpendicular on the first anode element surface of 0°.

Herein, also all through-going conduits of the first carrier element 10 are going through the first carrier element 10 in form of straight lines having an angle relating to the perpendicular on the first carrier element surface of 0°.

The through-going conduits of the first anode element and of the first carrier element 10 possess thereby in this preferred case an identical angle of 0°.

Furthermore, the first anode element is completely surrounded by the first carrier element 10, wherein the side of said first carrier element 10 directed towards said first anode element has a cavity to take said first anode element in such a way that the upper edges of the first carrier element 10 and of the first anode element are aligned.

The preferred embodiment shown in FIG. 1 further comprises a first anode segment 2, a second anode segment 3, and an intermediate spacing 4 between said first and second anode segment 2, 3 of the first anode element. In this preferred embodiment, the third anode segment of the first anode element is shown as most exterior anode area 9.

Further, FIG. 1 exhibit inside the first anode segment 2 four different fastening and electrical contact elements 5 of the first anode segment 2 of the first anode element, while inside the third anode segment 9 of the first anode element four different fastening and electrical contact elements 6 are shown. Hereby, these four different fastening and electrical contact elements 6 are placed outside of the circular second anode segment 3 of the first anode element. Finally, there are fastening elements 11 of the first carrier element 10.

Additionally, FIG. 1 shows a plurality of plugs 7 of the first device element 1 in the first anode segment 2 of the first anode element, which are circularly arranged around the center 8 of the first device element 1.

Figure 2:
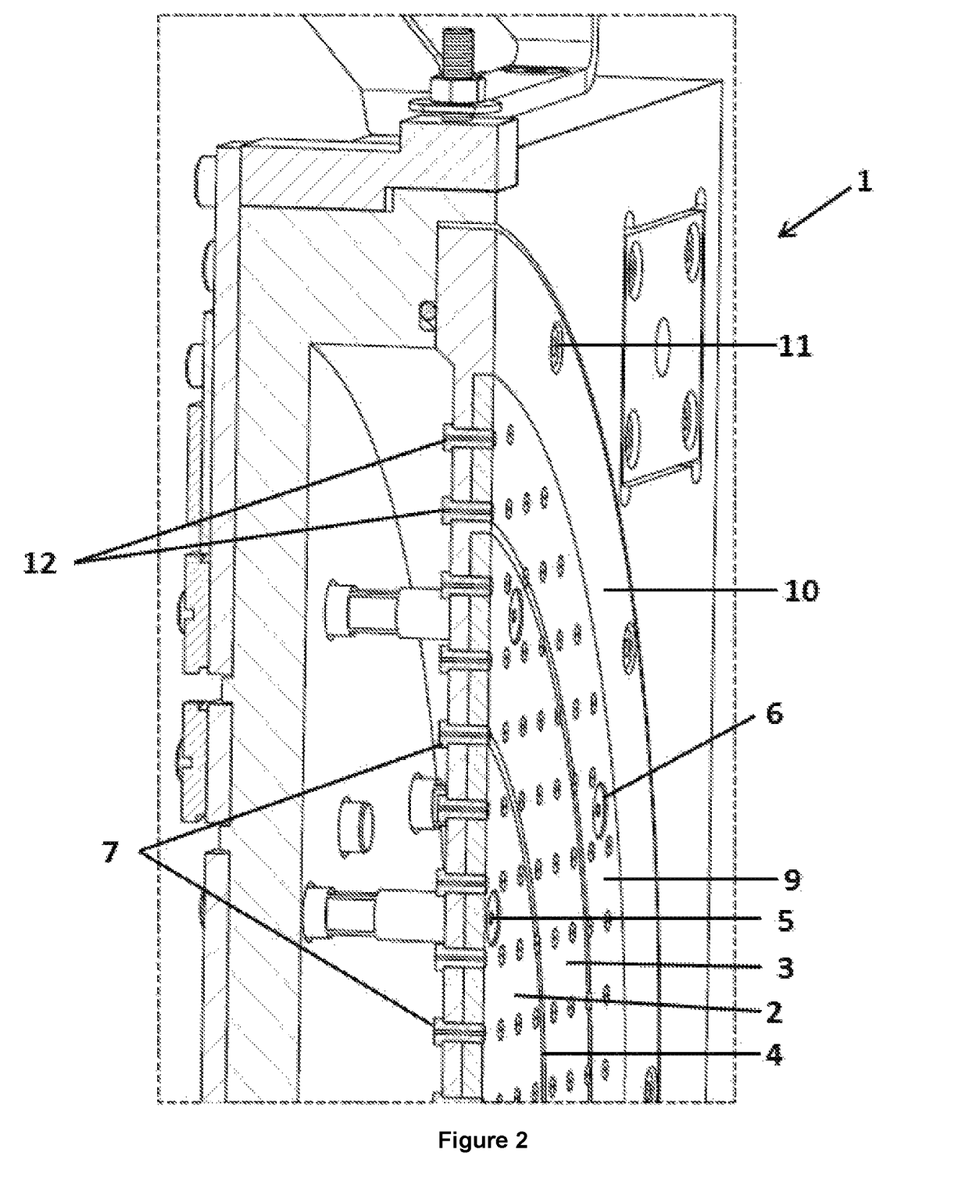
FIG. 2 shows a section perspective view of the device shown in FIG. 1.

FIG. 2 shows a section perspective view of the device shown in FIG. 1. Herein, FIG. 2 is supposed to facilitate the understanding of the present invention by illustrating in an enlarged view of the plurality of plugs 7.

Herein, a section perspective view, which is dividing a series of plugs 7 by half, shall facilitate to recognize that each plug 7 comprises a through-going channel 12, and that the end of all plugs 7 are aligned with the surface of the first anode element, wherein all of the plugs 7 are detachably connected to the first device element 1. It is also better to recognize in this enlarged view that the through-going channel 12 of each plug 7 comprises the same constant diameter over the whole length of the through-going channel (12).

Figure 3:
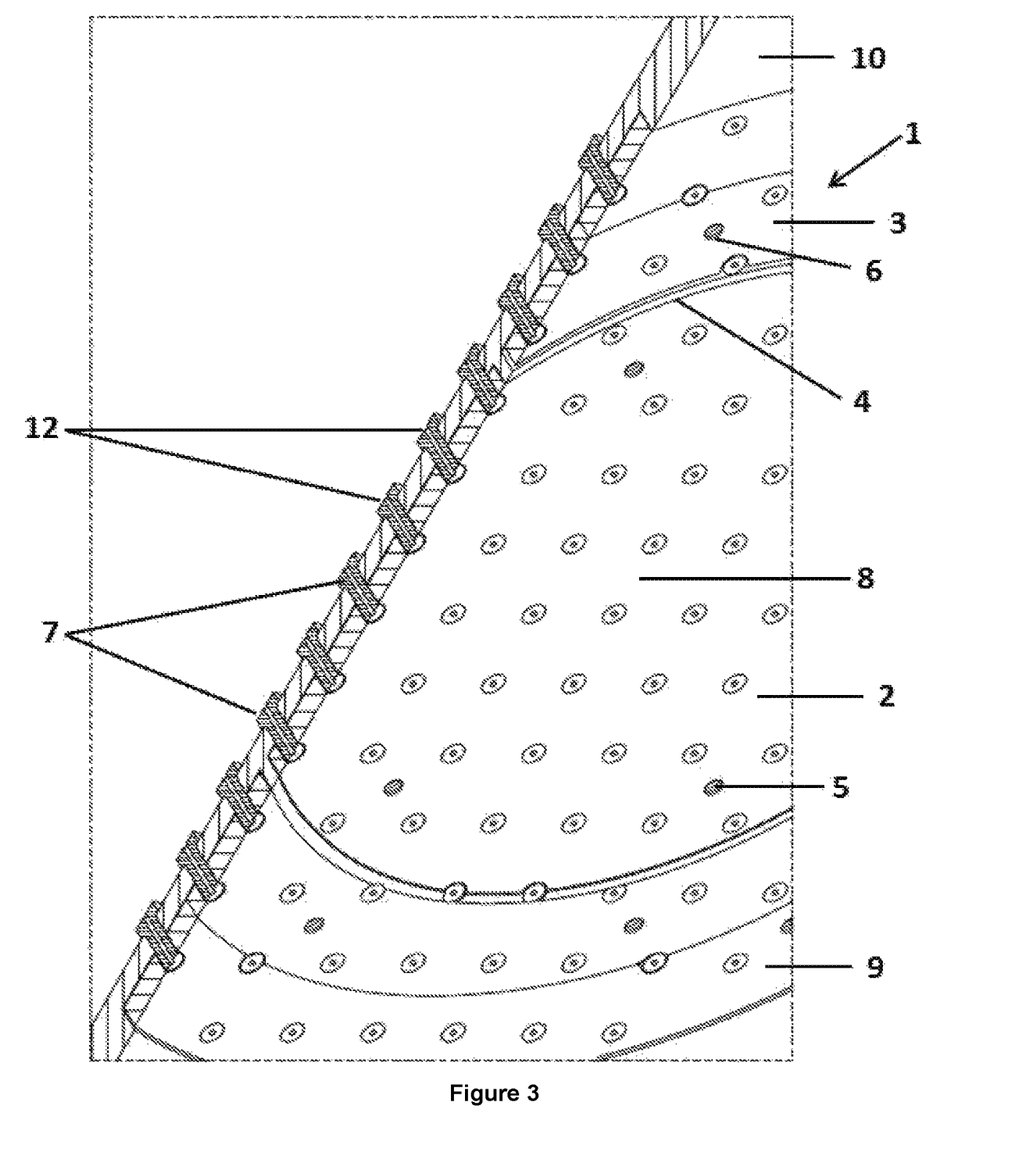
FIG. 3 shows a section perspective view of the first anode element firmly connected to the first carrier element of the first device element of the device shown in FIG. 1.
Figure 4:
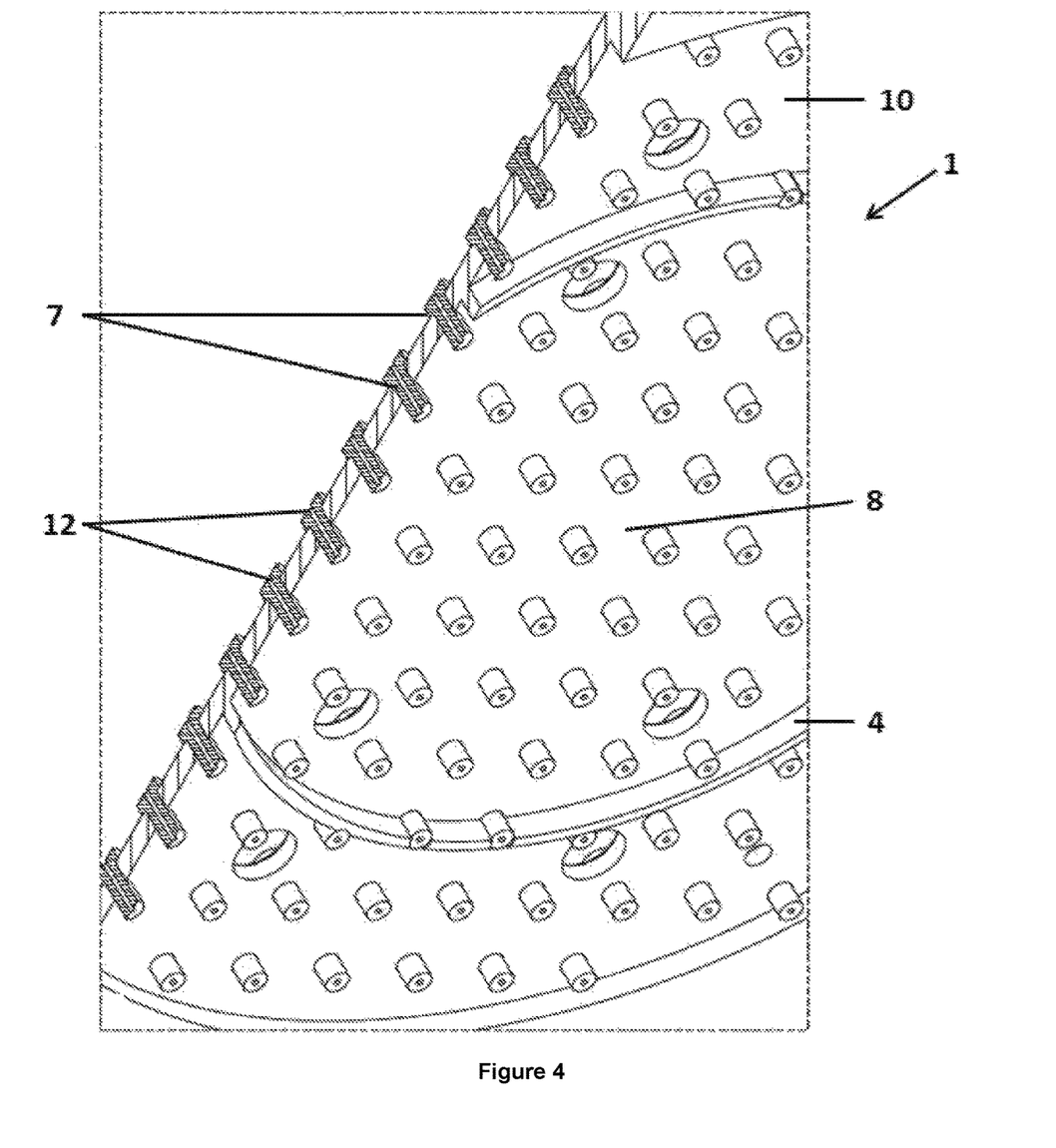
FIG. 4 shows a section perspective view of the first carrier element of the first device element of the device shown in FIG. 3.

FIG. 3 shows another section perspective view of the first device element 1 shown in FIG. 1, while FIG. 4 shows the same section perspective view of the first device element 1 as shown in FIG. 3, but without the first anode element, which has been removed for illustration purposes. Thereby, the geometrical shape and the arrangement of the plugs 7 can be even better recognized, even when in daily practice the anode element has to be included of course.

While the principles of the invention have been explained in relation to certain particular embodiments, and are provided for purposes of illustration, it is to be understood that various modifications thereof will become apparent to those skilled in the art upon reading the specification. Therefore, it is to be understood that the invention disclosed herein is intended to cover such modifications as fall within the scope of the appended claims. The scope of the invention is limited only by the scope of the appended claims.

REFERENCE SIGNS

1 First device element
2 First anode segment of the first anode element
3 Second anode segment of the first anode element
4 Intermediate spacing between first and second anode segment of the first anode element
5 Fastening element and electrical contact element of the first anode segment of the first anode element
6 Fastening element and electrical contact element of the third anode segment of the first anode element
7 Plugs of the first device element
8 Center of the first device element
9 Most exterior anode area of the first anode element
10 First carrier element of the first device element
11 Fastening element of the first carrier element
12 Through-going channel of a plug

The invention claimed is:

1. Device for vertical galvanic metal deposition on a substrate, wherein the device comprises at least a first device element and a second device element, which are arranged in a vertical manner parallel to each other; wherein the first device element comprises at least a first anode element having a plurality of through-going conduits and at least a first carrier element having a plurality of through-going conduits; wherein said at least first anode element and said at least first carrier element are firmly connected to each other; wherein the second device element comprises at least a first substrate holder which is adapted to receive at least a first substrate to be treated, wherein said at least first substrate holder is at least partially surrounding the at least first substrate to be treated along its outer frame after receiving it, characterized in that the at least first device element further comprises a plurality of plugs, wherein each plug comprises at least a through-going channel, and wherein each plug is arranged in such a way that each plug is running from a backside of the at least first carrier element through one of said plurality of through-going conduits of the at least first carrier element and further through a respective in front lying through-going conduit of the plurality of through-going conduits of the at least first anode element; and wherein all of the plurality of plugs are detachably connected to the at least first device element, wherein a selected one or more of the plurality of plugs may be replaced with different plugs by a detachable connection.

2. Device according to claim 1 characterized in that an end of at least a part of the plurality of plugs is aligned with a surface of the at least first anode element, wherein the end of at least part of the plurality of plugs ends precisely at the surface of the at least first anode element.

3. Device according to claim 1 characterized in that the through-going channel of each plug comprises the same constant diameter over the whole length of the through-going channel.

4. Device according to claim 1 characterized in that the through-going channel of the plurality of plugs comprises a constant diameter over the whole length of the through-going channel, which is different among the plurality of the plugs.

5. Device according to claim 4 characterized in that the constant diameter is decreasing from a center of the at least first device element to a more exterior position in the at least first device element.

6. Device according to claim 1 characterized in that the at least first device element further comprises a plurality of dummy plugs, wherein said plurality of dummy plugs do not possess any kind of through-going channel.

7. Device according to claim 1 characterized in that the plurality of through-going conduits of the at least first anode element are going through the at least first anode element in form of straight lines having an angle relating to the perpendicular on the at least first anode element surface ranging from 0° to 80°, or alternatively ranging from 0° to 20°.

8. Device according to claim 1 characterized in that the plurality of through-going conduits of the at least first carrier element are going through the at least first carrier element in form of straight lines having an angle relating to the perpendicular on a surface of the at least first carrier element between 0° and 80°, or alternatively ranging from 0° to 20°.

9. Device according to claim 1 characterized in that the plurality of through-going conduits of the at least first anode element are going through the at least first anode element in form of straight lines having an angle α relating to the perpendicular on the at least first anode element surface, wherein the plurality of through-going conduits of the at least first carrier element are going through the at least first carrier element in form of straight lines having an angle β relating to the perpendicular on a surface of the at least first carrier element, and wherein α and β are essentially the same.

10. Device according to claim 1 characterized in that the at least first anode element is at least partially surrounded by the at least first carrier element, wherein the side of said at least first carrier element directed towards said at least first anode element has a cavity to take said at least first anode element in such a way that the upper edges of the at least first carrier element and of the at least first anode element are aligned or not.

11. Device according to claim 1 characterized in that the at least first anode element is an insoluble anode comprising a material coated with titanium or an iridium oxide.

12. Method for vertical galvanic metal deposition on a substrate characterized by the following method steps:
   i) Providing a device according to claim 1,
   ii) Guiding an electrolytic volume flow through the through-going channels of the plurality of plugs to a side of the at least first substrate to be treated received by the at least first substrate holder of the second device element, wherein said side of the at least first substrate is directed to an anode surface of the first anode element of the first device element,
   iii) Moving the second device element in two directions parallel to the treated side of the at least first substrate to be treated, wherein the two directions, into which the at least first substrate to be treated is moved, are orthogonal to each other and/or wherein the substrate is moved in an oscillating manner.

13. Method according to claim 12 characterized in that
   in method step i) the device comprises further a third device element, wherein the second device element is arranged between the first device element and the third device element and wherein said third device element comprises at least a first anode element having a plurality of through-going conduits and at least a first carrier element having a plurality of through-going conduits; wherein said at least first anode element and said at least first carrier element are firmly connected to each other; wherein the third device element further comprises a plurality of plugs, wherein each plug comprises at least a through-going channel, and wherein each plug is arranged in such a way that each plug is running from the backside of the at least first carrier element through a through-going conduit of the plurality of through-going conduits of the at least first carrier element and further through the respective in front lying through-going conduit of the plurality of through-going conduits of the at least first anode element; and that
   in method step ii) a second electrolytic volume flow is guided through the through-going channels of the plurality of plugs to the side of the at least first substrate to be treated received by the at least first substrate holder of the second device element, wherein said side of the at least first substrate is directed to the anode surface of the first anode element of the third device element; and that
   in method step iii) the second device element is moved between the first device element and the third device element in two directions parallel to the treated side of the at least first substrate to be treated, wherein the two directions, into which the at least first substrate to be treated is moved, are orthogonal to each other and/or wherein the substrate is moved in an oscillating manner.

* * * * *